(12) United States Patent  (10) Patent No.: US 8,102,727 B2
Hirabayashi  (45) Date of Patent: Jan. 24, 2012

(54) SEMICONDUCTOR MEMORY DEVICE

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 344 days.

(21) Appl. No.: 12/430,283

(22) Filed: Apr. 27, 2009

(65) Prior Publication Data

US 2009/0279377 A1  Nov. 12, 2009

(30) Foreign Application Priority Data

May 12, 2008 (JP) ................... 2008-124357

(51) Int. Cl.
*G11C 8/00* (2006.01)
(52) U.S. Cl. .......... 365/230.05; 365/230.06; 365/230.08
(58) Field of Classification Search ............ 365/230.05, 365/230.08, 230.06
See application file for complete search history.

(56) References Cited

U.S. PATENT DOCUMENTS

| | | | | |
|---|---|---|---|---|
| 6,917,560 B2 * | 7/2005 | Nii | ............ | 365/230.05 |
| 6,958,948 B2 * | 10/2005 | Shiraishi | .................. | 365/230.05 |
| 7,145,829 B1 * | 12/2006 | Kim et al. | ................ | 365/189.15 |

OTHER PUBLICATIONS

Leland Chang, et al., "Stable SRAM Cell Design for the 32nm Node and Beyond", 2005 Symposium on VLSI Technology Digest of Technical Papers, pp. 128-129.
U.S. Appl. No. 12/474,498, filed May 29, 2009, Hirabayashi.

* cited by examiner

*Primary Examiner* — Son Dinh
(74) *Attorney, Agent, or Firm* — Oblon, Spivak, McClelland, Maier & Neustadt, L.L.P.

(57) ABSTRACT

A semiconductor memory device comprises a memory cell array including a plurality of mutually intersecting word lines and bit lines, and a plurality of memory cells connected at intersections thereof and each having a read port and a write port provided independently; and a plurality of word line drivers operative to drive the word lines. The elements contained in the memory cell have respective sizes in common with the elements contained in the word line driver.

20 Claims, 10 Drawing Sheets

SEMICONDUCTOR MEMORY DEVICE

CROSS-REFERENCE TO RELATED APPLICATION

This application is based upon and claims the benefit of priority from the prior Japanese Patent Application No. 2008-124357, filed on May 12, 2008, the entire contents of which are incorporated herein by reference.

BACKGROUND OF THE INVENTION

1. Field of the Invention

The present invention relates to a semiconductor memory device, for example, a semiconductor memory device such as an SRAM, of which word line is split to support byte write and so forth.

2. Description of the Related Art

An achievement of low power consumption in an LSI requires a low supply voltage, of which lower limit is though determined by an SRAM in the LSI in many cases. On the other hand, in a memory cell of the 6-transistor type used in the conventional SRAM, data becomes unstable when a word line is selected because a node contained in a flip-flop is slightly pulled up. Therefore, operation with a low supply voltage may destruct data and cause a disturbance phenomenon possibly.

As a measure against such the disturbance problem, an SRAM using memory cells of the 8-transistor type having a read port separated is proposed (Document 1: L. Chang, et al., Symposium on VLSI Technology 2005, p 128). In the memory cell of the 8-transistor type, a node in a flip-flop is not pulled up even when a word line is selected at the time of read. Therefore, the stability of data in the flip-flop increases and the data destruction can not be caused easily. Even in this case, however, at the time of write, it operates in a similar manner as the conventional memory cell of the 6-transistor type. Accordingly, avoidance of the disturbance problem at the time of write requires writing to all memory cells of which write word line is selected.

In general, an SRAM requires a byte write function of controlling data write at a unit of one byte. With this regard, the use of the memory cells of the 8-transistor type to avoid the disturbance problem and realize the byte write function causes a requirement of splitting and controlling a word line at a minimum write unit, that is, on a byte basis. Therefore, it is required to provide word line drivers by the number of split, which increases the chip area.

A cell array in the SRAM has a layout that utilizes the periodicity of the layout pattern, which is higher in dense than general logic circuits. Therefore, dummy cells are required at the outer circumferential ends of the cell array to ensure the periodicity. In particular, when the word line drivers are provided on a byte basis as described above, dummy cells are required on a byte basis and cause a further increase in chip area as a problem.

SUMMARY OF THE INVENTION

In an aspect the present invention provides a semiconductor memory device, comprising: a memory cell array including a plurality of mutually intersecting word lines and bit lines, and a plurality of memory cells connected at intersections thereof and each having a read port and a write port provided independently; and a plurality of word line drivers operative to drive the word lines. The elements contained in the memory cell have respective sizes in common with the elements contained in the word line driver.

In another aspect the present invention provides a semiconductor memory device, comprising: a memory cell array including a plurality of mutually intersecting word lines and bit lines, and a plurality of memory cells connected at intersections thereof and each having a read port and a write port provided independently; and a plurality of word line drivers operative to drive the word lines. The elements contained in the memory cell have respective layouts in common with the elements contained in the word line driver.

In yet another aspect the present invention provides a semiconductor memory device, comprising: a memory cell array including a plurality of mutually intersecting word lines and bit lines, and a plurality of memory cells connected at intersections thereof and each having a read port and a write port provided independently; and a plurality of word line drivers operative to drive the word lines. The memory cell array and the word line drivers have an integer ratio between layout periods in at least one of the word line direction and the bit line direction.

DETAILED DESCRIPTION OF THE EMBODIMENTS

The embodiments associated with the semiconductor memory device according to the present invention will now be described in detail with reference to the drawings.

First Embodiment

Figure 1:
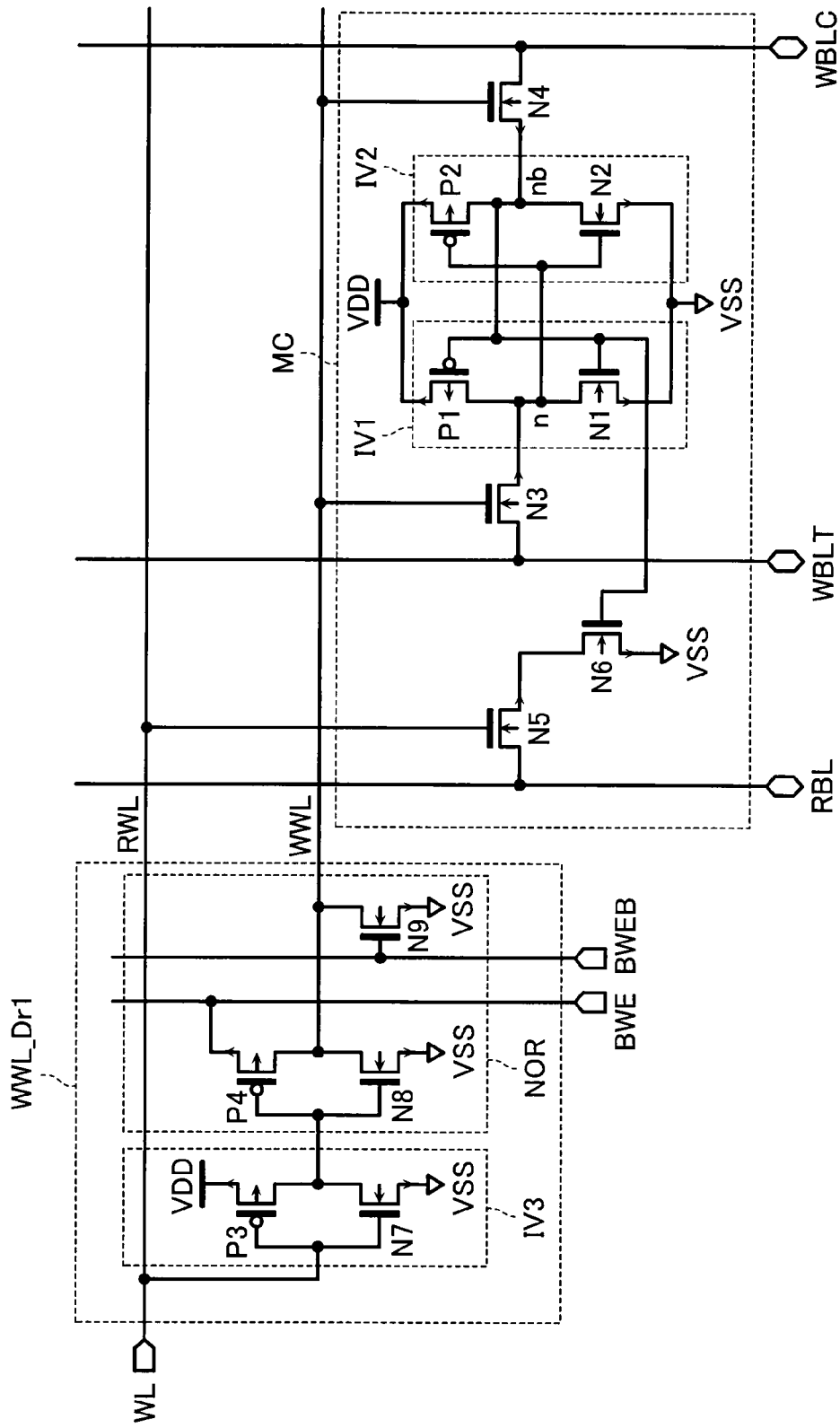
FIG. 1 is a circuit diagram of a memory cell and a word line driver in a semiconductor memory device according to a first embodiment of the present invention.

FIG. 1 is a circuit diagram of a memory cell and a word line driver in a semiconductor memory device according to a first embodiment of the present invention.

The semiconductor memory device according to the present embodiment comprises a read word line RWL provided in the row direction; a write word line WWL provided in parallel with the read word line RWL and split into several; and a read bit line RBL and a write bit line pair WBL composed of a first WBTL and a second write bit line WBLC provided in the column direction crossing the read word line RWL and the write word line WWL. Connected at an intersection of the read word line RWL and write word line WWL and the read bit line RBL and write bit line pair WBL is one of plural memory cells MC having a read port and a write port provided independently. The write word line WWL has one end provided with a word line driver WWL_Dr1 for driving the write word line WWL.

The memory cell MC is a memory cell of the 8-transistor type, which includes a first inverter IV1 containing a first load transistor or a PMOS transistor P1 and a first drive transistor or an NMOS transistor N1, connected in complementary pair, and having sources connected to the supply line VDD and the ground line VSS, respectively; and a second inverter IV2 containing a second load transistor or a PMOS transistor P2 and a second drive transistor or an NMOS transistor N2, connected in complementary pair, and having sources connected to the supply line VDD and the ground line VSS, respectively. These inverters IV1, IV2 have respective inputs and outputs cross-connected. A first transfer transistor or an NMOS transistor N3 is connected between the first write bit line WBLT and the output terminal of the first inverter IV1. A second transfer transistor or an NMOS transistor N4 is connected between the second write bit line WBLC and the output terminal of the second inverter IV2. The NMOS transistors N3, N4 have respective gates, which are connected to the write word line WWL. A third transfer transistor or an NMOS transistor N5 having a drain connected to the read bit line RBL and a gate connected to the read word line RWL, and a third drive transistor or an NMOS transistor N6 having a source connected to the ground line VSS, a drain connected to the source of the NMOS transistor N5, and a gate connected to the input terminal of the first inverter IV1 are provided to configure the memory cell MC.

The word line driver WWL_Dr1 includes a third inverter IV3 having an input terminal connected to a word line WL also serving as the read word line RWL, and a NOR gate operative to receive the output from the third inverter IV3 and write enable signals BWE, BWEB for giving permission of write to the memory cell MC and having an output terminal connected to the write word line WWL. The write enable signals BWE, BWEB are signals for giving permission of write to a designated byte, including two signals: a first write enable signal BWE in positive logic, which exhibits "H", and a second write enable signal BWEB in negative logic, which exhibits "L", on giving permission of write. These two signals BWE, BWEB are shared by word line drivers WWL_Dr1 located on the same column. The third inverter IV3 contains a third load transistor or a PMOS transistor P3 and a fourth drive transistor or an NMOS transistor N7, connected in complementary pair, and having sources connected to the supply line VDD and the ground line VSS, respectively. On the other hand, the NOR gate contains a fourth load transistor or a PMOS transistor P4 having a source connected to the first write enable signal line BWE, and a fifth drive transistor or an NMOS transistor N8 having a source connected the ground line VSS. The PMOS transistor P4 and the NMOS transistor N8 have gates and drains, which are connected to the output terminal of the third inverter IV3 and the read word line WWL, respectively. The NOR gate further contains a sixth drive transistor or an NMOS transistor N9 having a drain connected to the read word line WWL, and a gate connected to the second write enable signal line BWEB.

The following description is given to operation of the semiconductor memory device according to the present embodiment.

First, reading data from the memory cell MC is described.

Prior to data read, the read word line RBL is previously precharged to "H".

In this state, when the word line WL is selected and becomes "H", the read word line RBL also becomes "H", thereby turning on the NMOS transistor N5. If the cell node nb is at "L", the NMOS transistor N6 still remains off to hold the read word line RBL at "H" unchanged. On the other hand, if the cell node nb is at "H", the NMOS transistor N6 is turned on to start discharge from the read word line RBL to the ground line VSS via the NMOS transistors N5 and N6, and the read word line RBL is pulled down to "L". The voltage level appeared on the read word line RBL is sensed and amplified at a sense amplifier, not shown, thereby reading data from the memory cell MC.

Next, writing data to the memory cell MC is described. In this example, writing "H" and "L" to the cell nodes n and nb is described.

Initially, a write circuit, not shown, is used to set the write bit lines WBLT, WBLC at "H", "L", respectively.

In this state, when the word line WL is selected and becomes "H", the input and the output of the inverter IV3 become "H", "L", respectively. At the time of data write, the voltage levels on the first and second write enable signal lines BWE and BWEB become "H" and "L", respectively. Therefore, the drains of the PMOS transistor P4 and the NMOS transistor N8 are turned to "H". The NMOS transistor N8 is not turned on because the gate thereof is at "L". Accordingly, the voltage level on the write word line WWL becomes "H", which turns on the NMOS transistors N5 and N6.

Thus, the voltages on the write bit lines WBLT and WBLC flow in the cell nodes n and nb and are held in the flip-flop composed of the inverters IV1 and IV2 to achieve data write.

At the time of data write, not only the write word line WWL but also the read word line RWL may become "H" with no trouble on operation. Accordingly, whether it is at the time of data read or at the time of data write, the read word line RWL on the selected row is made "H". Thus, although power consumption is increased, the signal lines in the row direction can be made fewer than when the read word line RWL is made "H" only at the time of data read.

The following description is given to layouts of the memory cell MC and the word line driver WWL_Dr1 in the semiconductor memory device according to the present embodiment.

Figure 2:
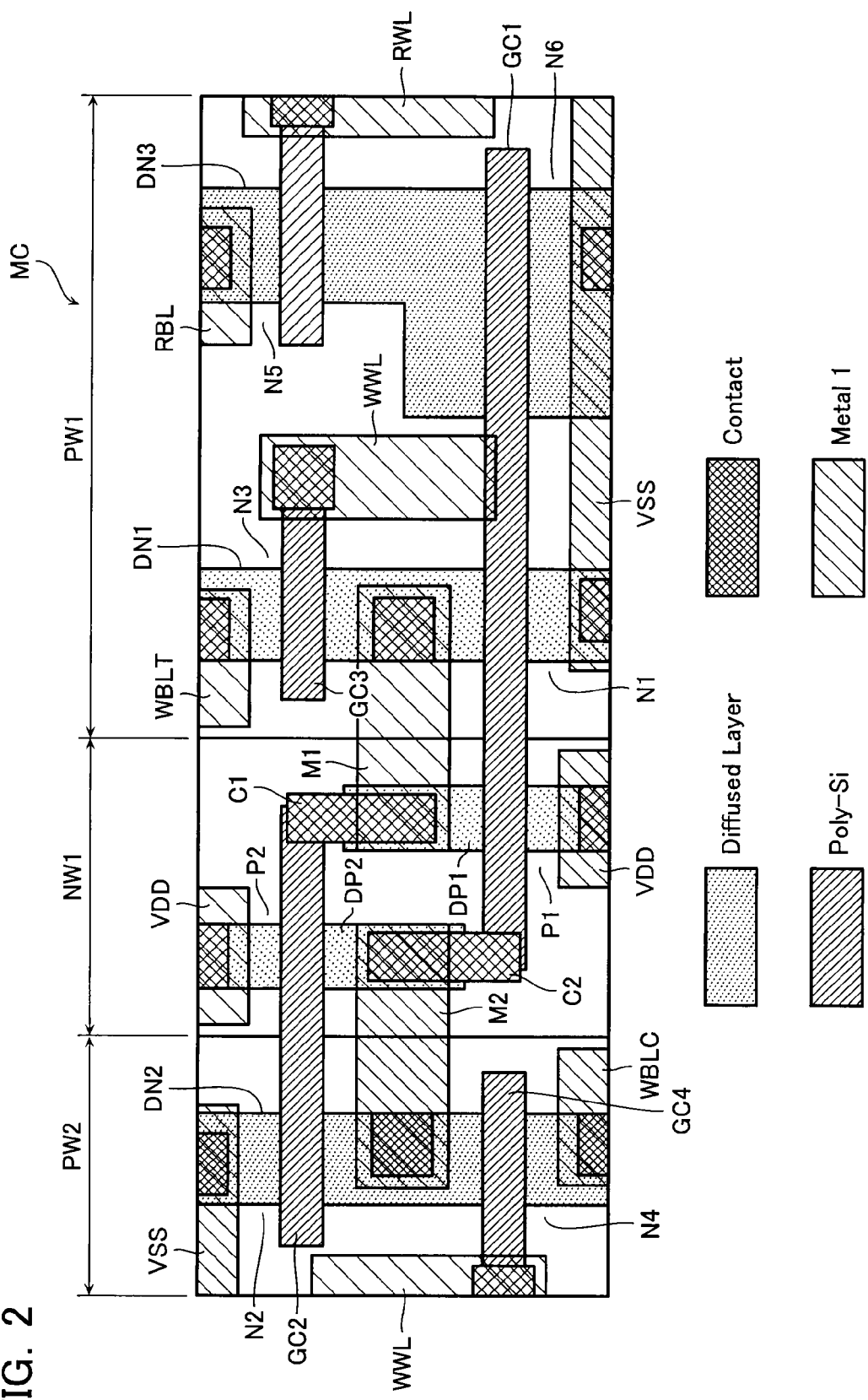
FIG. 2 is a plan view showing a layout of the memory cell in the same semiconductor memory device.

FIG. 2 is a plan view showing a layout of the memory cell MC in the semiconductor memory device according to the present embodiment.

One memory cell MC is formed in three parallel well regions NW1, PW1, PW2 including an N well region NW1, and P well regions PW1, PW2 arranged on both sides thereof. The N well region NW1 includes P-type diffused layers DP1, DP2 formed in the shape of stripes extending in parallel with the N well region NW1. The P well regions PW1, PW2 include N-type diffused layers DN1 and DN3, DN2 formed in the shape of stripes extending in parallel with the P well regions PW1, PW2, respectively. These five diffused layers DP1, DP2, DN1, DN2 and DN3 are formed in the shape of stripes in parallel with the well regions to reduce variations in process among the diffused layers.

PMOS transistors P1, P2 are formed along the P-type diffused layers DP1, DP2 in the N well region NW1. NMOS transistors N1, N3 are formed serially along the N-type diffused layer DN1 in the P well region PW1. NMOS transistors N2, N4 are formed serially along the N-type diffused layer DN2 in the P well region PW2. NMOS transistors N5, N6 are formed serially along the N-type diffused layer DN3 in the P well region PW1. The transistors P1, N1, N6 have a common gate GC1, which is formed of polysilicon in the shape of a stripe crossing the boundary between the well regions NW1, PW1. The transistors P2, N2 have a common gate GC2, which is formed of polysilicon in the shape of a stripe crossing the boundary between the well regions NW1, PW2. The transistors P1, N1 have respective drains, which are connected with each other via a metal layer M1 crossing the boundary between the well regions NW1, PW1 and connected via a contact C1 to the common gate GC2 of the transistors P2, N2. The transistors P2, N2 have respective drains, which are connected with each other via a metal layer M2 crossing the boundary between the well regions NW1, PW2 and connected via a contact C2 to the common gate GC1 of the transistors P1, N1, N6. The transistors P1, P2 have respective sources, which are connected to the supply line VDD in the upper layer. The transistors N1, N2, N6 have respective sources, which are connected via contacts to the ground line VSS. The transistors N3, N4 have respective gates GC3, GC4, which are formed of polysilicon in the shape of stripes crossing the boundary between the well regions PW1, PW2 and connected via contacts to the write word line WWL formed in the upper layer. The transistors N3, N4 have respective sources, which are connected via contacts to the write bit lines WBLT, WBLC formed in the upper layer, respectively. The transistor N5 has a source, which is connected via a contact to the read bit line RBL formed in the upper layer.

Figure 3:
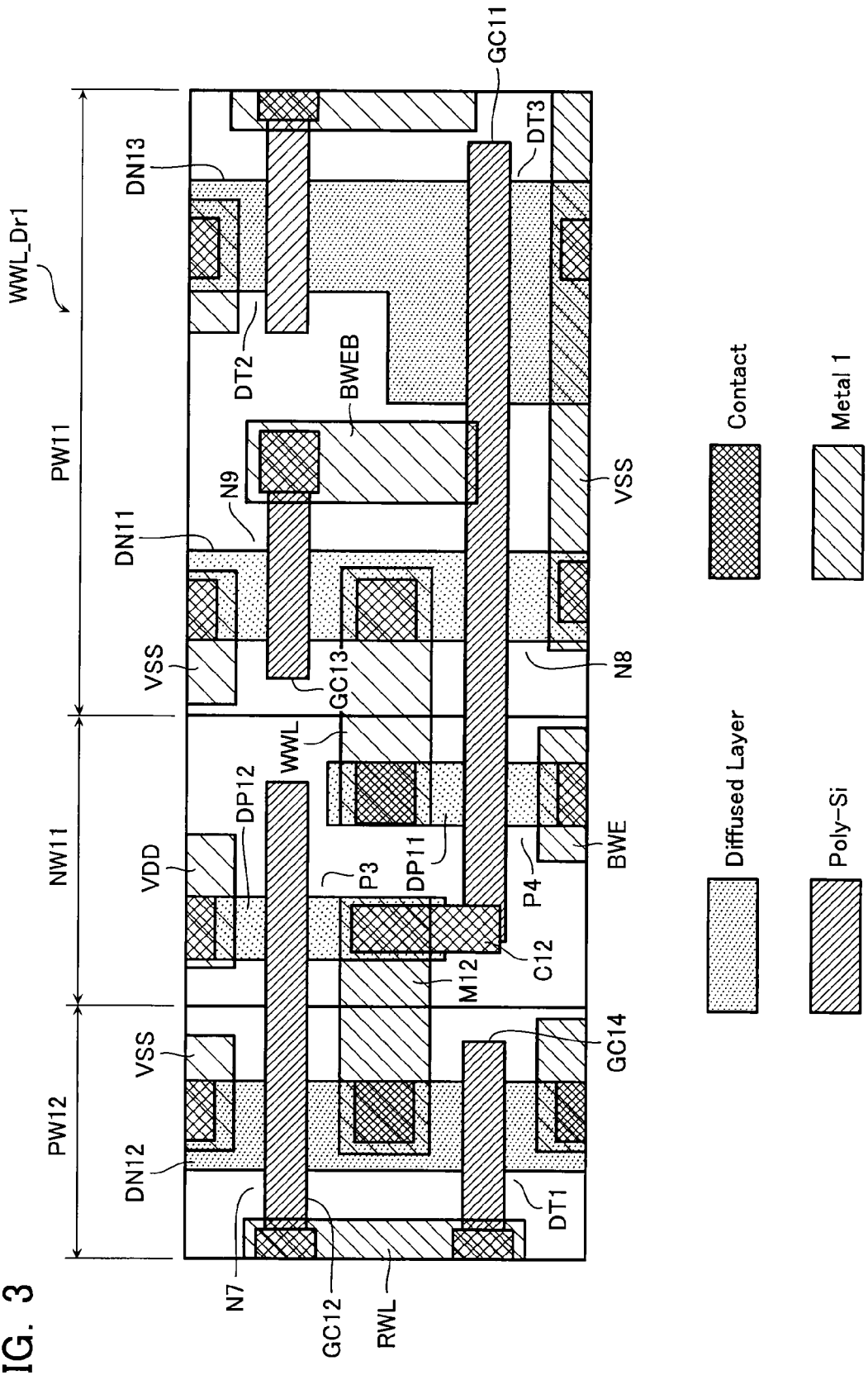
FIG. 3 is a plan view showing a layout of the word line driver in the same semiconductor memory device.

FIG. 3 is a plan view showing a layout of the word line driver WWL_Dr1 in the semiconductor memory device according to the present embodiment.

One word line driver WWL_Dr1 is formed in three parallel well regions NW11, PW11, PW12 including an N well region NW11, and P well regions PW11, PW12 arranged on both sides thereof. The N well region NW11 includes P-type diffused layers DP11, DP12 formed in the shape of stripes extending in parallel with the N well region NW11. The P well regions PW11, PW12 include N-type diffused layers DN11 and DN13, DN12 formed in the shape of stripes extending in parallel with the P well regions PW11, PW12, respectively.

PMOS transistors P4, P3 are formed along the P-type diffused layers DP11, DP12 in the N well region NW11. NMOS transistors N8, N9 are formed serially along the N-type diffused layer DN11 in the P well region PW11. An NMOS transistor N7 and a dummy NMOS transistor DT1, not shown in FIG. 1, are formed serially along the N-type diffused layer DN12 in the P well region PW12. Dummy NMOS transistors DT2, DT3, not shown in FIG. 1, are formed serially along the N-type diffused layer DN13 in the P well region PW11. The transistors P4, N8, DT3 have a common gate GC11, which is formed of polysilicon in the shape of a stripe crossing the boundary between the well regions NW11, PW11. The transistors P3, N7 have a common gate GC12, which is formed of polysilicon in the shape of a stripe crossing the boundary between the well regions NW11, PW12 and connected via a contact to the read word line RWL formed in the upper layer. The transistors P4, N8 have respective drains, which are connected to the write word line WWL via a metal layer M1 crossing the boundary between the well regions NW11, PW11. The transistors P3, N7 have respective drains, which are connected with each other via a metal layer M12 crossing the boundary between the well regions NW11, PW12 and connected via a contact C12 to the common gate GC11 of the transistors P4, N8, DT3. The transistor P3 has a source, which is connected to the supply line VDD in the upper layer. The transistors N7, N8, N9, DT3 have respective sources, which are connected via contacts to the ground line VSS. The transistor P4 has a source, which is connected via a contact to the write enable signal line BWE. The transistors N9, DT1 have respective gates GC13, GC14, which are formed of polysilicon in the shape of stripes crossing the boundary between the well regions PW11, PW12 and connected via contacts to the read word line RWL and the bit enable signal line BWE formed in the upper layer, respectively. The transistor P9 has a source, which is connected via contacts to the write enable signal lines WBLT, WBLC formed in the upper layer, respectively.

As obvious from FIGS. 2 and 3, the word line driver WWL_Dr1 in accordance with the above layout has the same size as that of the memory cell MC in accordance with the layout shown in FIG. 2, and elements contained in these are also equal in size. The memory cell MC and the word line driver WWL_Dr1 are almost identical in layout except for contacts and metal lines in part.

The following description is given to an arrangement of the semiconductor memory device using the memory cell MC and the word line driver WWL_Dr1 in accordance with the above layouts.

Figure 4:
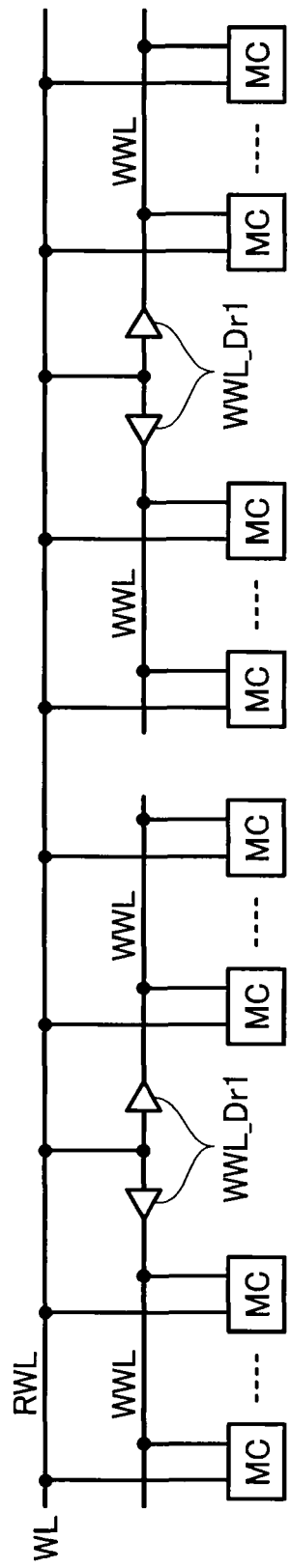
FIG. 4 is a circuit block diagram of the memory cells and the word line drivers in the same semiconductor memory device.

FIG. 4 is a circuit block diagram of the memory cells MC and the word line drivers WWL_Dr1 in the semiconductor memory device according to the present embodiment.

One word line WL in the semiconductor memory device according to the present embodiment is connected as the read word line RWL to all memory cells MC in the word line WL direction. In contrast, one write word line WWL is split at a certain number of memory cells MC. One word line driver WWL_Dr1 is connected to each split write word line WWL. For example, if the semiconductor memory device has a byte write function, the number of memory cells MC connected to the write word line WWL per split is 8. The memory cells MC located on the same row are connected to the read word line RWL. Two word line drivers WWL_Dr1 adjacent in the row direction have a common contact to the read word line RWL and are arranged in the opposite directions.

Figure 5:
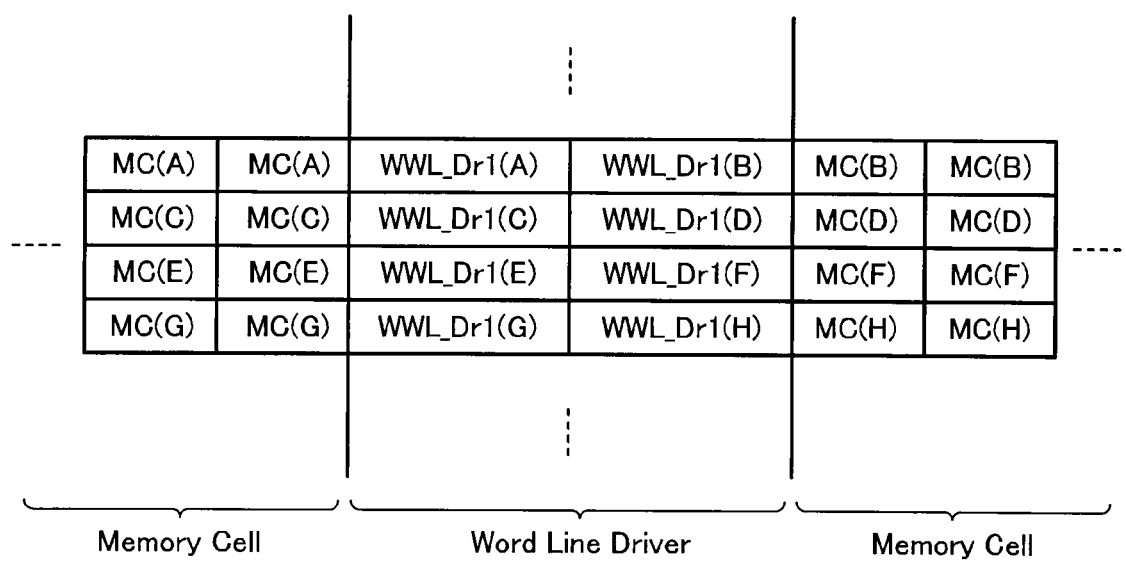
FIG. 5 is a block diagram of the memory cells and the word line drivers in the same semiconductor memory device.

FIG. 5 is a block diagram of the memory cells MC and the word line drivers WWL_Dr1 in the semiconductor memory device according to the present embodiment.

One row in the semiconductor memory device according to the present embodiment includes successively repeated patterns of a certain number of memory cells MC, two word line drivers WWL_Dr1, and a certain number of memory cells MC arranged in this order in the row direction with no gap. Repetitions of such the row in the column direction configure one cell array. The word line drivers WWL_Dr1 adjacent in the row direction or the column direction are laterally inverted or vertically inverted in layout. Similarly, the memory cells MC adjacent in the row direction or the column direction are laterally inverted or vertically inverted in layout. The word line driver WWL_Dr1(A) shown in FIG. 5 is used to drive the write word line WWL in the memory cell MC(A), and the word line drivers WWL_Dr1(B)-(H) are used similarly.

In accordance with the present embodiment, two word line drivers WWL_Dr1 can be arranged successively with no gap therebetween, and the memory cell MC and the word line driver WWL_Dr1 can be arranged successively with no gap therebetween. In addition, the memory cells MC and the word line drivers WWL_Dr1 keep the periodicity of layouts, which eliminates the need for dummy cells accordingly. Thus, it is possible to provide a semiconductor memory device of which chip area can be suppressed to increase in accordance with the write word line split.

Second Embodiment

Figure 6:
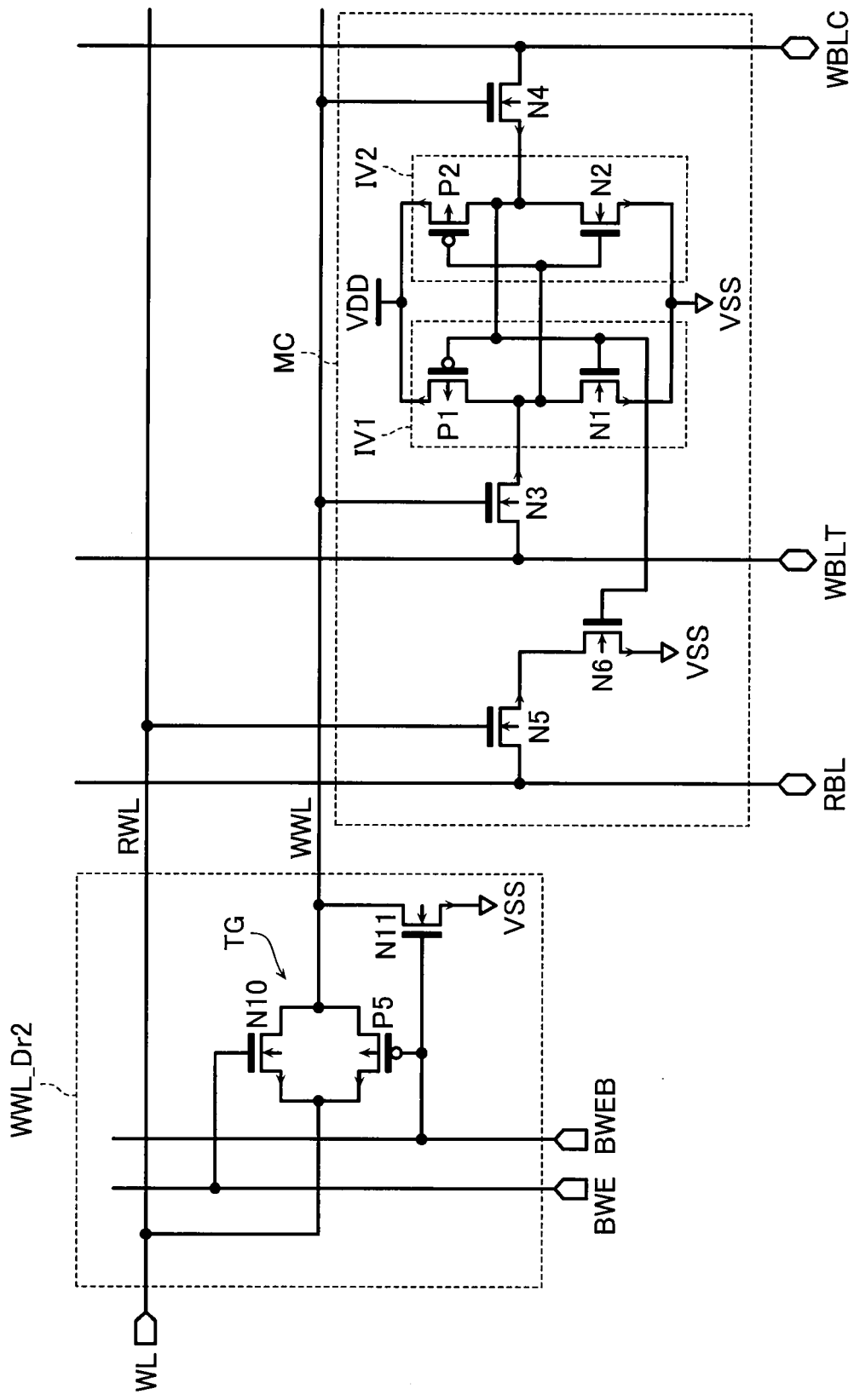
FIG. 6 is a circuit diagram of a memory cell and a word line driver in a semiconductor memory device according to a second embodiment of the present invention.

FIG. 6 is a circuit diagram of a memory cell and a word line driver in a semiconductor memory device according to a second embodiment of the present invention.

The semiconductor memory device according to the present embodiment comprises a word line driver WWL_Dr2 including a transfer gate in place of the word line driver WWL_Dr1 in the first embodiment.

The word line driver WWL_Dr2 includes a transfer gate TG having an input terminal connected to the read word line RWL and an output terminal connected to the write word line WWL, and a pull-down NMOS transistor N11 having a source connected to the ground line VSS, and a drain connected to the write word line WWL. The transfer transistor TG includes an NMOS transistor N10 and a PMOS transistor P5, of which sources and drains are mutually connected. The NMOS transistor N10 has a gate, which is connected to the first write enable signal line BWE. The PMOS transistor P5 and the NMOS transistor N11 have respective gates, which are connected to the second write enable signal line BWEB.

Subsequently, operation of the semiconductor memory device according to the present embodiment is described. The following description is given to operation of the word line driver WWL_Dr2, which is the difference from the first embodiment.

Operation at the time of data read is similar to that in the first embodiment because it does not depend on the operation of the word line driver WWL_Dr2.

Operation of the word line driver WWL_Dr2 at the time of data write is described next.

At the time of data write, the first and second write enable signals BWE and BWEB are at "H", "L", respectively. Therefore, the transistors N10 and P5 are turned on to bring the transfer gate TG into the open state and connect the word line WL with the write word line WWL. On the other hand, the transistor N11 is turned off and accordingly the write word line WWL is not connected to the ground line VSS. As a result, the write word line WWL is brought to the same voltage level as that on the word line WL. In a word, when the word line WL is selected, it becomes "H". Accordingly, the NMOS transistors N3 and N4 are turned on to write data to the memory cell MC.

As the read word line RWL is connected to the word line WL, the voltage level thereon is at "H" when the word line WL is selected and "L" when not selected whether it is at the time of data read or at the time of data writ.

The following description is given to a layout of the word line driver WWL_Dr2 in the semiconductor memory device according to the present embodiment.

Figure 7:
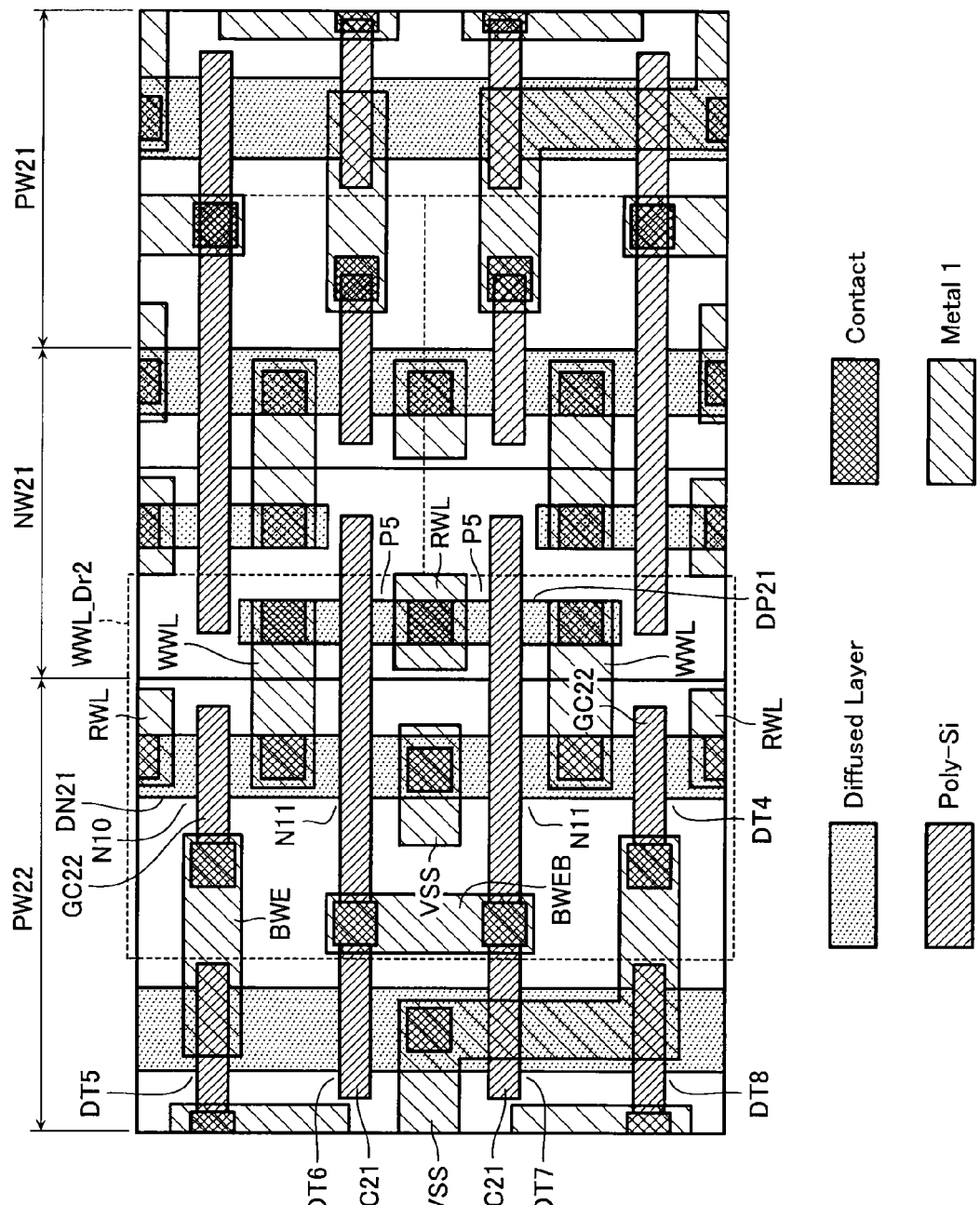
FIG. 7 is a plan view showing a layout of the word line driver in the same semiconductor memory device.

FIG. 7 is a plan view showing the layout of the word line driver WWL_Dr2 in the semiconductor memory device according to the second embodiment. A region surrounded with the dotted line in the figure corresponds to the layout of one word line driver WWL_Dr2.

One word line driver WWL_Dr2 is formed in two parallel well regions NW21, PW22 including an N well region NW21 and a P well region PW22. The N well region NW21 includes a P-type diffused layer DP21 formed in the shape of a stripe extending in parallel with the N well region NW21. The P well region PW22 includes an N-type diffused layer DN21 formed in the shape of a stripe extending in parallel with the P well region PW22.

The P-type diffused layer DP21 in the N well region NW21 includes the PMOS transistors P5 composed of two PMOS transistors formed to ensure the drivability. The N-type diffused layer DN21 in the P well region PW22 includes the NMOS transistor N10, the NMOS transistors N11 composed of two NMOS transistors to ensure the drivability, and the dummy NMOS transistor DT4 to ensure the periodicity of layouts, formed in series. The common gate GC21 of the transistors P5, N11 is formed of polysilicon in the shape of a stripe crossing the boundary between the well regions NW21, PW22 and connected to the write bit line BWEB formed in the upper layer. The source and drain of the PMOS transistor P5 are connected via contacts to the read word line RWL and the write word line WWL formed in the upper layer, respectively. The source and drain of the NMOS transistor N11 are connected via contacts to the ground line VSS and the write word line WWL formed in the upper layer, respectively. The gate GC22 of the NMOS transistor N10 is formed of polysilicon in the shape of a stripe crossing the P well region PW22 and connected to the first write enable signal line BWE formed in the upper layer, and the source and drain thereof are connected via contacts to the read word line RWL and the write word line WWL formed in the upper layer, respectively.

The word line driver WWL_Dr2 in accordance with the above layout has a length about half in the row direction and double in the column direction relative to the memory cell MC shown in FIG. 2. The word line drivers WWL_Dr2 adjacent in the row direction are arranged half shifted in the column direction.

The following description is given to an arrangement of the semiconductor memory device using the memory cell MC and the word line driver WWL_Dr2 in accordance with the above layouts.

Figure 8:
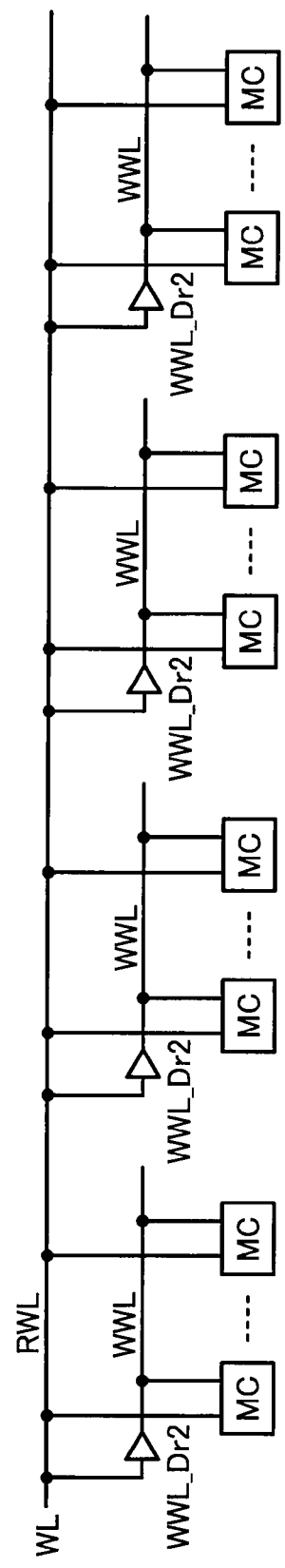
FIG. 8 is a circuit block diagram of the memory cells and the word line drivers in the same semiconductor memory device.

FIG. 8 is a circuit block diagram of the memory cells MC and the word line drivers WWL_Dr2 in the semiconductor memory device according to the present embodiment.

In the present embodiment, the word line drivers WWL_Dr2 are arranged in the same direction, different from the first embodiment shown in FIG. 4.

Figure 9:
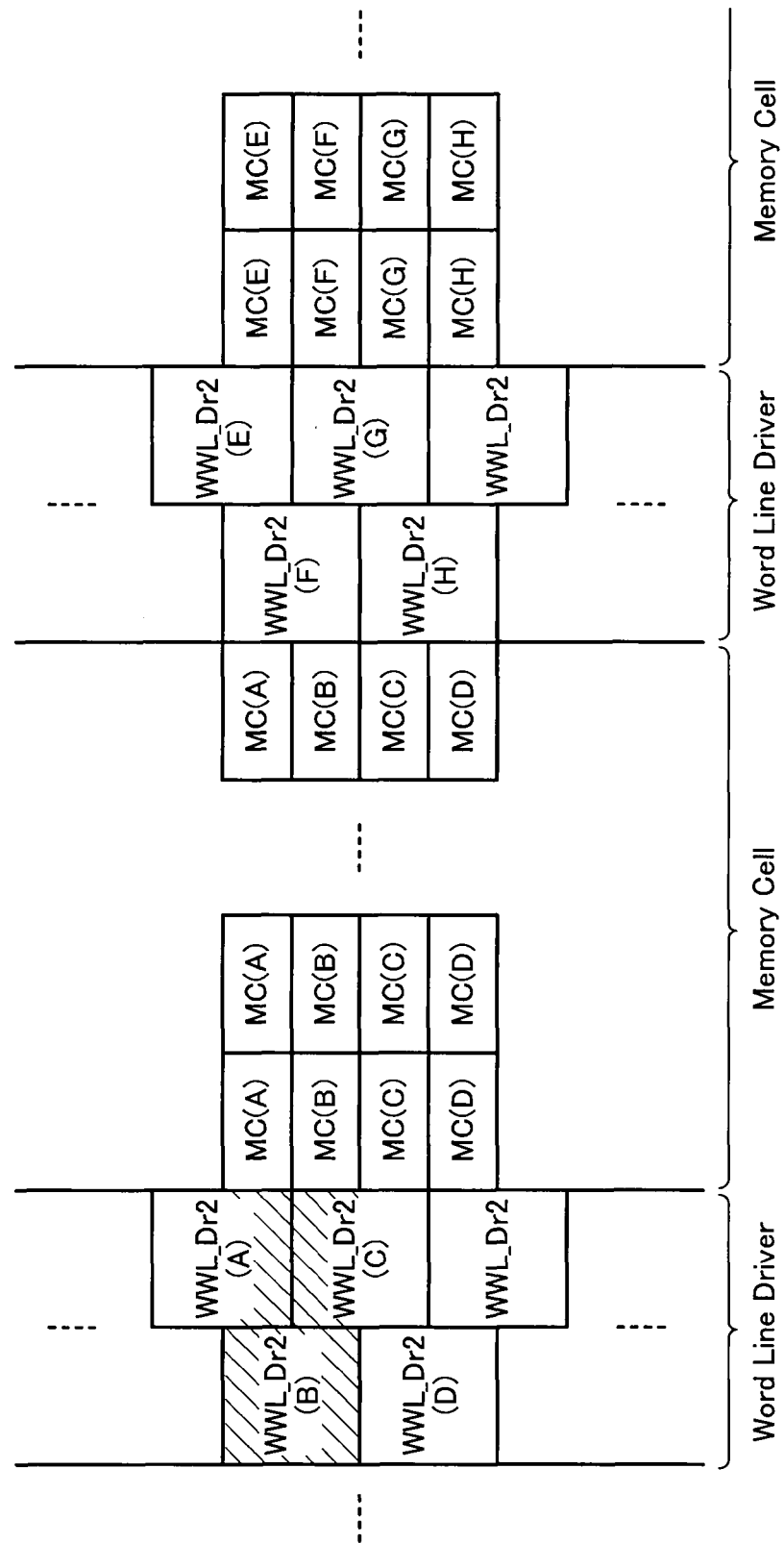
FIG. 9 is a block diagram of the memory cells and the word line drivers in the same semiconductor memory device.

FIG. 9 is a block diagram of the memory cells MC and the word line drivers WWL_Dr2 in the semiconductor memory device according to the present embodiment. A region hatched in the figure corresponds to one layout shown in FIG. 7.

One layout shown in FIG. 7 is arranged, and two series of a certain number of memory cells MC are arranged adjacent thereto and aligned in the row direction. Two memory cells MC adjacent in the row direction or in the column direction are laterally or vertically inverted in layout.

The word line driver WWL_Dr2(A) is used to drive the write word line WWL in the memory cell MC(A), and the word line drivers WWL_Dr2(B)-(H) are used similarly.

FIG. 10 provides views of the memory cell MC and the word line driver WWL_Dr2 in the semiconductor memory device according to the present embodiment of which layouts are compared with each other.

Figure 10A:
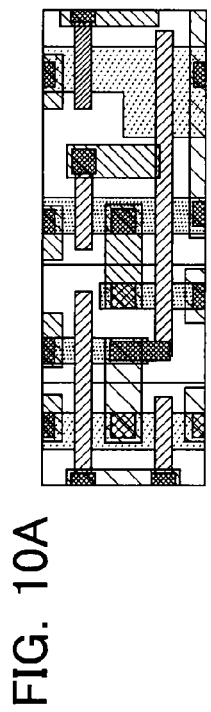
FIG. 10 provides plan views of the memory cell and the word line driver in the same semiconductor memory device of which layouts are compared with each other.
Figure 10C:
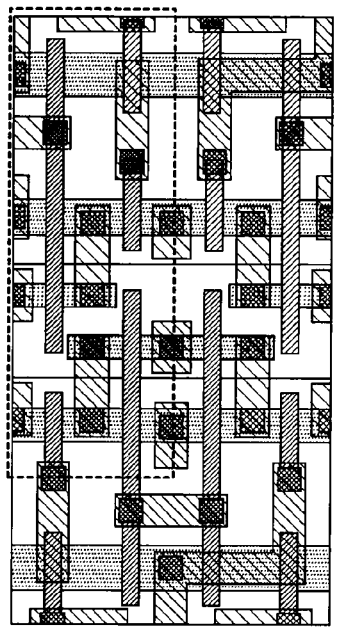
Figure 10E:
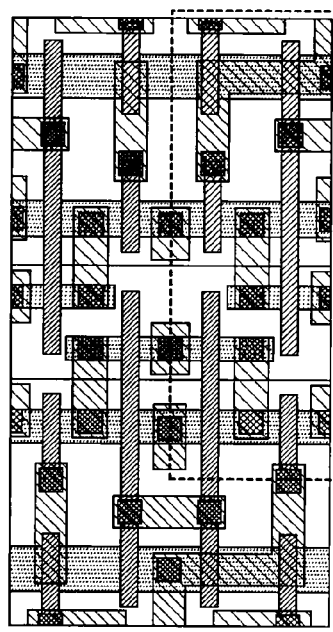
Figure 10B:
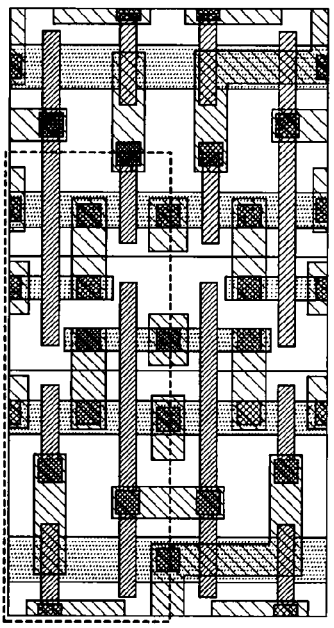
Figure 10D:
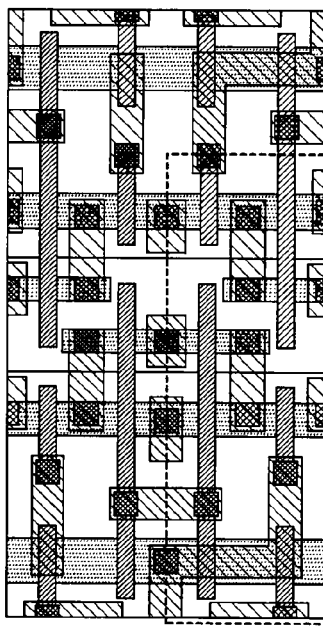

FIG. 10A represents an original position of the memory cell MC. FIGS. 10B-E show the word line driver WWL_Dr2. The memory cell MC in FIG. 10A is same in size and layout as the dotted region in FIG. 10E except for contacts and metal lines in part, as can be found. Similarly, the dotted regions in FIGS. 10B-D have sizes and layouts in common with those in which the memory cells MC in FIG. 10A are laterally inverted, vertically inverted, and laterally and vertically inverted.

In accordance with the present embodiment, the word line driver WWL_Dr2 and the memory cell MC can be arranged successively, and the memory cells and the word line drivers keep the periodicity of layouts, which eliminates the need for dummy cells accordingly. Thus, it is possible to provide a semiconductor memory device of which chip area can be suppressed to increase.

[Others]

The present invention has been described about the memory cell of the 8-transistor type though it is also applicable to a memory cell of the 10-transistor type, which includes memory cells of the 8-transistor type modified to have complementary read ports.

What is claimed is:

1. A semiconductor memory device, comprising:
a memory cell array including a plurality of mutually intersecting word lines and bit lines, and a plurality of memory cells connected at intersections thereof and each having a read port and a write port provided independently; and
a plurality of word line drivers operative to drive said word lines,
wherein the elements contained in said memory cell have substantially the same sizes as the elements contained in said word line driver, respectively.

2. The semiconductor memory device according to claim 1, wherein the elements contained in said memory cell have respective layouts in common with the elements contained in said word line driver.

3. The semiconductor memory device according to claim 1, wherein said word lines include a read word line and a write word line,
said bit lines include a read bit line and a first and a second write bit line,
said memory cell includes
a first inverter containing a first load transistor and a first drive transistor and having an input terminal and an output terminal,
a second inverter containing a second load transistor and a second drive transistor and having an input terminal connected to the output terminal of said first inverter and an output terminal connected to the input terminal of said first inverter,
a first transfer transistor connected between the output terminal of said first inverter and said first write bit line and having a gate connected to said write word line,
a second transfer transistor connected between the output terminal of said second inverter and said second write bit line and having a gate connected to said write word line,
a third drive transistor having a source connected to the ground line, and a gate connected to the input terminal of said first inverter, and
a third transfer transistor having a source connected to the drain of said third drive transistor, a drain connected to said read bit line, and a gate connected to said read word line,
said word line driver includes
a third inverter containing a third load transistor and a fourth drive transistor and having an input terminal connected to said read word line, and
a NOR gate containing a fourth load transistor having a source connected to a first write enable signal line for giving permission of data write to said memory cell, a drain connected to said write word line, and a gate connected to the output terminal of said third inverter, a fifth drive transistor having a source connected the ground line, a drain connected to said write word line, and a gate connected to the output terminal of said third inverter, and a sixth drive transistor having a source connected the ground line, a drain connected to said write word line, and a gate connected to a second write enable signal line opposite in logic to said first write enable signal line,
said write word line is selected when said read word line is selected and said first write enable signal line is activated.

4. The semiconductor memory device according to claim 3, wherein the layouts of said third load transistor, said fourth load transistor, said fourth drive transistor, said fifth drive transistor, and said sixth drive transistor in said word line driver correspond to the layouts of said second load transistor, said first load transistor, said second drive transistor, said first drive transistor, and said third drive transistor in said memory cell, respectively.

5. The semiconductor memory device according to claim 3, wherein a certain one of said memory cells and another one of said memory cells adjacent to said certain memory cell have line-symmetric layouts,
a certain one of said word line drivers and another one of said word line drivers adjacent to said certain word line driver have line-symmetric layouts.

6. The semiconductor memory device according to claim 1, wherein said word lines include a read word line and a write word line,
said bit lines include a read bit line and a first and a second write bit line,
said memory cell includes
a first inverter containing a first load transistor and a first drive transistor and having an input terminal and an output terminal,
a second inverter containing a second load transistor and a second drive transistor and having an input terminal connected to the output terminal of said first inverter and an output terminal connected to the input terminal of said first inverter,
a first transfer transistor connected between the output terminal of said first inverter and said first write bit line and having a gate connected to said write word line,
a second transfer transistor connected between the output terminal of said second inverter and said second write bit line and having a gate connected to said write word line,
a third drive transistor having a source connected to the ground line, and a gate connected to the input terminal of said first inverter, and
a third transfer transistor having a source connected to the drain of said third drive transistor, a drain connected to said read bit line, and a gate connected to said read word line,
said word line driver includes
a transfer gate connected between a first write enable signal line for giving permission of data write to said memory cell and a second write enable signal line opposite in logic to said first write enable signal line and having an input terminal connected to said read word line and an output line connected to said write word line, and
a pull-down transistor having a source connected to the ground line, a drain connected to said write word line, and a gate connected to said second write enable signal line,
said transfer gate is turned on and said pull-down transistor is turned off when said first write enable signal line is activated,
said transfer gate is turned off and said pull-down transistor is turned on when said first write enable signal line is inactivated.

7. The semiconductor memory device according to claim 1, wherein a certain number of said memory cells and one of said word line drivers are arranged continuously in array.

8. A semiconductor memory device, comprising:
a memory cell array including a plurality of mutually intersecting word lines and bit lines, and a plurality of memory cells connected at intersections thereof and each having a read port and a write port provided independently; and
a plurality of word line drivers operative to drive said word lines, wherein the elements contained in said memory cell have substantially the same layouts as the elements contained in said word line driver, respectively.

9. The semiconductor memory device according to claim 8, wherein said memory cell array and said word line drivers have an integer ratio between layout periods in at least one of the word line direction and the bit line direction.

10. The semiconductor memory device according to claim 8, wherein said word lines include a read word line and a write word line,
said bit lines include a read bit line and a first and a second write bit line,
said memory cell includes
a first inverter containing a first load transistor and a first drive transistor and having an input terminal and an output terminal,
a second inverter containing a second load transistor and a second drive transistor and having an input terminal connected to the output terminal of said first inverter and an output terminal connected to the input terminal of said first inverter,
a first transfer transistor connected between the output terminal of said first inverter and said first write bit line and having a gate connected to said write word line,
a second transfer transistor connected between the output terminal of said second inverter and said second write bit line and having a gate connected to said write word line,
a third drive transistor having a source connected to the ground line, and a gate connected to the input terminal of said first inverter, and
a third transfer transistor having a source connected to the drain of said third drive transistor, a drain connected to said read bit line, and a gate connected to said read word line,
said word line driver includes
a third inverter containing a third load transistor and a fourth drive transistor and having an input terminal connected to said read word line, and
a NOR gate containing a fourth load transistor having a source connected to a first write enable signal line for giving permission of data write to said memory cell, a drain connected to said write word line, and a gate connected to the output terminal of said third inverter, a fifth drive transistor having a source connected the ground line, a drain connected to said write word line, and a gate connected to the output terminal of said third inverter, and a sixth drive transistor having a source connected the ground line, a drain connected to said write word line, and a gate connected to a second write enable signal line opposite in logic to said first write enable signal line,
said write word line is selected when said read word line is selected and said first write enable signal line is activated.

11. The semiconductor memory device according to claim 10, wherein the layouts of said third load transistor, said fourth load transistor, said fourth drive transistor, said fifth drive transistor, and said sixth drive transistor in said word line driver correspond to the layouts of said second load transistor, said first load transistor, said second drive transistor, said first drive transistor, and said third drive transistor in said memory cell, respectively.

12. The semiconductor memory device according to claim 10, wherein a certain one of said memory cells and another one of said memory cells adjacent to said certain memory cell have line-symmetric layouts,
a certain one of said word line drivers and another one of said word line drivers adjacent to said certain word line driver have line-symmetric layouts.

13. The semiconductor memory device according to claim 8, wherein said word lines include a read word line and a write word line,
said bit lines include a read bit line and a first and a second write bit line,
said memory cell includes
a first inverter containing a first load transistor and a first drive transistor and having an input terminal and an output terminal,
a second inverter containing a second load transistor and a second drive transistor and having an input terminal connected to the output terminal of said first inverter and an output terminal connected to the input terminal of said first inverter,
a first transfer transistor connected between the output terminal of said first inverter and said first write bit line and having a gate connected to said write word line,
a second transfer transistor connected between the output terminal of said second inverter and said second write bit line and having a gate connected to said write word line,
a third drive transistor having a source connected to the ground line, and a gate connected to the input terminal of said first inverter, and
a third transfer transistor having a source connected to the drain of said third drive transistor, a drain connected to said read bit line, and a gate connected to said read word line,
said word line driver includes
a transfer gate connected between a first write enable signal line for giving permission of data write to said memory cell and a second write enable signal line opposite in logic to said first write enable signal line and having an input terminal connected to said read word line and an output line connected to said write word line, and
a pull-down transistor having a source connected to the ground line, a drain connected to said write word line, and a gate connected to said second write enable signal line,
said transfer gate is turned on and said pull-down transistor is turned off when said first write enable signal line is activated,
said transfer gate is turned off and said pull-down transistor is turned on when said first write enable signal line is inactivated.

14. The semiconductor memory device according to claim 8, wherein a certain number of said memory cells and one of said word line drivers are arranged continuously in array.

15. A semiconductor memory device, comprising:
a memory cell array including a plurality of mutually intersecting word lines and bit lines, and a plurality of memory cells connected at intersections thereof and each having a read port and a write port provided independently; and
a plurality of word line drivers operative to drive said word lines,
wherein said memory cell array and said word line drivers have an integer ratio between layout periods in at least one of the word line direction and the bit line direction.

16. The semiconductor memory device according to claim 15, wherein said word lines include a read word line and a write word line,
said bit lines include a read bit line and a first and a second write bit line, said memory cell includes
a first inverter containing a first load transistor and a first drive transistor and having an input terminal and an output terminal,
a second inverter containing a second load transistor and a second drive transistor and having an input terminal connected to the output terminal of said first inverter and an output terminal connected to the input terminal of said first inverter,
a first transfer transistor connected between the output terminal of said first inverter and said first write bit line and having a gate connected to said write word line,
a second transfer transistor connected between the output terminal of said second inverter and said second write bit line and having a gate connected to said write word line,
a third drive transistor having a source connected to the ground line, and a gate connected to the input terminal of said first inverter, and
a third transfer transistor having a source connected to the drain of said third drive transistor, a drain connected to said read bit line, and a gate connected to said read word line,
said word line driver includes
a third inverter containing a third load transistor and a fourth drive transistor and having an input terminal connected to said read word line, and
a NOR gate containing a fourth load transistor having a source connected to a first write enable signal line for giving permission of data write to said memory cell, a drain connected to said write word line, and a gate connected to the output terminal of said third inverter, a fifth drive transistor having a source connected the ground line, a drain connected to said write word line, and a gate connected to the output terminal of said third inverter, and a sixth drive transistor having a source connected the ground line, a drain connected to said write word line, and a gate connected to a second write enable signal line opposite in logic to said first write enable signal line,
said write word line is selected when said read word line is selected and said first write enable signal line is activated.

17. The semiconductor memory device according to claim 16, wherein the layouts of said third load transistor, said fourth load transistor, said fourth drive transistor, said fifth drive transistor, and said sixth drive transistor in said word line driver correspond to the layouts of said second load transistor, said first load transistor, said second drive transistor, said first drive transistor, and said third drive transistor in said memory cell, respectively.

18. The semiconductor memory device according to claim 16, wherein a certain one of said memory cells and another one of said memory cells adjacent to said certain memory cell have line-symmetric layouts,
a certain one of said word line drivers and another one of said word line drivers adjacent to said certain word line driver have line-symmetric layouts.

19. The semiconductor memory device according to claim 15, wherein said word lines include a read word line and a write word line,
said bit lines include a read bit line and a first and a second write bit line,
said memory cell includes
a first inverter containing a first load transistor and a first drive transistor and having an input terminal and an output terminal,
a second inverter containing a second load transistor and a second drive transistor and having an input terminal connected to the output terminal of said first inverter and an output terminal connected to the input terminal of said first inverter,
a first transfer transistor connected between the output terminal of said first inverter and said first write bit line and having a gate connected to said write word line,
a second transfer transistor connected between the output terminal of said second inverter and said second write bit line and having a gate connected to said write word line,
a third drive transistor having a source connected to the ground line, and a gate connected to the input terminal of said first inverter, and
a third transfer transistor having a source connected to the drain of said third drive transistor, a drain connected to said read bit line, and a gate connected to said read word line,
said word line driver includes
a transfer gate connected between a first write enable signal line for giving permission of data write to said memory cell and a second write enable signal line opposite in logic to said first write enable signal line and having an input terminal connected to said read word line and an output line connected to said write word line, and
a pull-down transistor having a source connected to the ground line, a drain connected to said write word line, and a gate connected to said second write enable signal line,
said transfer gate is turned on and said pull-down transistor is turned off when said first write enable signal line is activated,
said transfer gate is turned off and said pull-down transistor is turned on when said first write enable signal line is inactivated.

20. The semiconductor memory device according to claim 15, wherein a certain number of said memory cells and one of said word line drivers are arranged continuously in array.

* * * * *